US011570907B2

(12) United States Patent
Lee et al.

(10) Patent No.: US 11,570,907 B2
(45) Date of Patent: Jan. 31, 2023

(54) MANUFACTURING APPARATUS FOR DISPLAY DEVICE AND METHOD OF USING THE SAME

(71) Applicant: Samsung Display Co. Ltd., Yongin-si (KR)

(72) Inventors: Jun Hee Lee, Seoul (KR); Dae Ho Yang, Asan-si (KR); Myung Soo Kyung, Suwon-si (KR); Tae Young Park, Asan-si (KR); Jun Hak Oh, Cheonan-si (KR); Seung Joo Lee, Seongnam-si (KR); Hyun Ho Jeong, Busan (KR); Jong Moon Heo, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 15 days.

(21) Appl. No.: 17/373,207

(22) Filed: Jul. 12, 2021

(65) Prior Publication Data
US 2021/0345497 A1    Nov. 4, 2021

Related U.S. Application Data

(62) Division of application No. 16/111,346, filed on Aug. 24, 2018, now Pat. No. 11,096,289.

(30) Foreign Application Priority Data

Sep. 5, 2017    (KR) .................. 10-2017-0113289

(51) Int. Cl.
*H05K 3/36* (2006.01)
*H05K 1/02* (2006.01)
(Continued)

(52) U.S. Cl.
CPC ........... *H05K 3/361* (2013.01); *G02F 1/1303* (2013.01); *G02F 1/13452* (2013.01);
(Continued)

(58) Field of Classification Search
CPC ... G02F 1/1303; G02F 1/13452; H01L 51/56; H05K 1/0269; H05K 1/928; H05K 1/147;
(Continued)

(56) References Cited

FOREIGN PATENT DOCUMENTS

CA    1284231    5/1991
JP    H0968682 A    3/1997
(Continued)

*Primary Examiner* — Carl J Arbes
(74) *Attorney, Agent, or Firm* — Cantor Colburn LLP

(57) ABSTRACT

A manufacturing method of a display device includes: loading, on a stage, a panel assembly including: a display panel drivable to display an image, and first and second printed circuit boards attached to the display panel, end portions of the first and second printed circuit boards overlapping each other; providing a jet of air to the overlapping end portion of the second printed circuit board to raise the overlapping end portion away from and expose the end portion of the first printed circuit board; fixing the raised end portion away from the exposed end portion of the first printed circuit board; pre-processing the exposed end portion of the first printed circuit board; and aligning a distal end of the pre-processed end portion of the first printed circuit board and a distal end of the end portion of the second printed circuit board.

9 Claims, 13 Drawing Sheets

(51) Int. Cl.
*H05K 3/22* (2006.01)
*G02F 1/13* (2006.01)
*G02F 1/1345* (2006.01)
*H05K 1/14* (2006.01)
*H01L 51/56* (2006.01)

(52) U.S. Cl.
CPC ............ *H05K 1/028* (2013.01); *H05K 1/147* (2013.01); *H05K 3/22* (2013.01); *H01L 51/56* (2013.01); *H05K 1/0269* (2013.01); *H05K 2201/055* (2013.01); *H05K 2201/09936* (2013.01); *H05K 2203/0165* (2013.01); *H05K 2203/0195* (2013.01); *H05K 2203/081* (2013.01); *H05K 2203/095* (2013.01); *H05K 2203/107* (2013.01); *H05K 2203/1476* (2013.01); *H05K 2203/1484* (2013.01); *H05K 2203/166* (2013.01); *H05K 2203/167* (2013.01)

(58) Field of Classification Search
CPC .... H05K 3/22; H05K 3/361; H05K 2201/055; H05K 2201/09936; H05K 2203/0165; H05K 2203/0195; H05K 2203/081; H05K 2203/095; H05K 2203/107; H05K 2203/1476; H05K 2203/1484; H05K 2203/167

See application file for complete search history.

(56) References Cited

FOREIGN PATENT DOCUMENTS

| | | | |
|---|---|---|---|
| JP | 2004-117791 | | 4/2004 |
| JP | 2008251695 | A | 10/2008 |
| KR | 1020080018677 | A | 2/2008 |
| KR | 101137509 | B1 | 4/2012 |
| KR | 1020130011263 | A | 1/2013 |
| KR | 20140131645 | A * | 11/2014 |
| KR | 1020140131645 | A | 11/2014 |
| KR | 101588570 | B1 | 1/2016 |
| WO | 2004/109860 | A2 | 12/2004 |
| WO | 2004/109860 | A3 | 12/2004 |

* cited by examiner

MANUFACTURING APPARATUS FOR DISPLAY DEVICE AND METHOD OF USING THE SAME

This application is a divisional application of U.S. application Ser. No. 16/111,346 filed Aug. 24, 2018, which claims priority to Korean Patent Application No. 10-2017-0113289 filed on Sep. 5, 2017, and all the benefits accruing therefrom under 35 U.S.C. 119, the contents of which in its entirety are herein incorporated by reference.

BACKGROUND

1. Field

The present disclosure relates to a display device, a manufacturing apparatus for a display device and a manufacturing method using the manufacturing apparatus for a display device.

2. Description of the Related Art

Display devices are increasingly important along with the development of multimedia. Accordingly, various types of display devices such as a liquid crystal display ("LCD"), an organic light emitting display ("OLED") and the like are used.

Electronic devices based on mobility thereof have been widely used. In addition to small electronic devices such as mobile phones, tablet personal computers ("PCs") are widely used as portable electronic devices.

In order to support various functions, the portable electronic device includes a display device for providing a user with visual information such as an image or video. As other components for driving the display device are miniaturized, a proportion of the display device in the electronic device is gradually increasing, and a structure in which the components can be deformed or bent to have a predetermined angle within a flat state of the overall display device is being developed.

SUMMARY

One or more embodiment of the present disclosure provide a manufacturing method of a display device, capable of reducing or effectively preventing damage to a printed circuit board in a manufacturing process.

Features of the present disclosure also provide a manufacturing apparatus of a display device, capable of reducing or effectively preventing damage to a printed circuit board in a manufacturing process.

However, features of the present disclosure are not restricted to those set forth herein. The above and other features of the present disclosure will become more apparent to one of ordinary skill in the art to which the present disclosure pertains by referencing the detailed description of the present disclosure given below.

According to an embodiment of the present disclosure, there is provided a manufacturing method of a display device, including: loading, on a stage, a panel assembly including a display panel which is drivable by a signal applied thereto to display an image, and a first printed circuit board and a second printed circuit board through which the signal is transmittable to the display panel, attached to the display panel, end portions of the first and second printed circuit boards disposed overlapping each other; providing a jet of air to the overlapping end portion of the second printed circuit board to raise the overlapping end portion of the second printed circuit board away from the end portion of the first printed circuit board and expose the end portion of the first printed circuit board; fixing the raised end portion of the second printed circuit board away from the exposed end portion of the first printed circuit board; pre-processing the exposed end portion of the first printed circuit board; and aligning a distal end of the pre-processed end portion of the first printed circuit board and a distal end of the end portion of the second printed circuit board.

Further, the end portions of the first and second printed circuit boards may be overlapped along an x-axis direction, said loading, on a stage, a panel assembly, may include disposing the overlapping end portions of the first and second printed circuit boards on a guide portion having an inclined surface inclined in the x-axis direction, and said providing a jet of air to the overlapping end portion of the second printed circuit board may include jetting the air along the inclined surface of the guide portion, in the x-axis direction, to raise the end portion of the second printed circuit board and expose the end portion of the first printed circuit board.

Further, said fixing the raised end portion of the second printed circuit board may include moving a fixing bar to support a lower surface of the raised end portion away from the exposed surface of the end portion of the first printed circuit board.

Further, said aligning distal ends of the first printed circuit board and the second printed circuit board may include interposing a push pin between the end portions of the first printed circuit board and the second printed circuit board overlapping each other.

Further, said loading, on a stage, a panel assembly, may include disposing the overlapping end portions of the first and second printed circuit boards on a guide portion adjacent to the display panel in an x-axis direction, the end portion of the first printed circuit board fixed to the guide portion, and said aligning distal ends of the first printed circuit board and the second printed circuit board may further include moving in the x-axis direction, the guide portion with the end portion of the first printed circuit board fixed thereto, the moving the guide portion in the x-axis direction moving the push pin away from the end portion of the second printed circuit board in a z-axis direction crossing the x-axis direction, to move the end portion of the first printed circuit board away from the end portion of the second printed circuit board in the z-axis direction.

Further, a moving distance of the push pin in the z-axis direction is equal to a moving distance of the guide portion in the x-axis direction.

Further, the method may further include with the distal ends of the first printed circuit board and the second printed circuit board aligned with each other, electrically connecting the pre-processed end portion of the first printed circuit board to the overlapping end portion of the second printed circuit board.

Further, a portion of the display panel may be exposed from the first and second printed circuit boards having the distal ends thereof aligned, and the method may further include irradiating a laser to the exposed portion of the display panel to perform marking of the display panel assembly.

Further, said pre-processing the exposed end portion of the first printed circuit board may include performing a plasma process or a flux process on the exposed end portion of the first printed circuit board.

According to an embodiment of the present disclosure, there is provided a manufacturing apparatus of a display device, including: a stage on which a panel assembly is seated, the panel assembly including: a display panel which is drivable by a signal applied thereto to display an image, and a first printed circuit board and a second printed circuit board through which the signal is transmittable to the display panel, attached to the display panel, end portions of the first and second printed circuit boards disposed overlapping each other; a guiding member disposed adjacent to the stage, to which the end portion of the first printed circuit board is fixable; an air blower which is adjacent to the guiding member and provides a jet of air; and a fixing bar on which the end portion of the second printed circuit board is supportable spaced apart from the end portion of the first printed circuit board, the fixing bar disposed above the guiding member.

Further, the guiding member may include: a fixing portion to which the end portion of the first printed circuit board is fixable, and a guide portion along which the jet of air is guided from the air blower to the overlapping end portions of the first and second printed circuit boards.

Further, the end portions of the first and second printed circuit boards disposed overlapping each other may extend from an end of the stage in an x-axis direction, and the fixing bar may have a length which extends along a y-axis direction crossing the x-axis direction, the fixing bar being movable in the x-axis direction to support a lower surface of the end portion of the second printed circuit board spaced apart from the end portion of the first printed circuit board.

Further, the manufacturing apparatus may further include a push pin disposed between the overlapping end portions of the first printed circuit board and the second printed circuit board.

Further, the end portions of the first and second printed circuit boards disposed overlapping each other may extend from an end of the stage in an x-axis direction, and movement in the x-axis direction of the guiding portion having the end portion of the first printed circuit board fixed thereto, may move the push pin away from the end portion of the second printed circuit board in a z-axis direction crossing the x-axis direction to move the end portion of the first printed circuit board away from the end portion of the second printed circuit board in the z-axis direction.

Further, a moving distance of the push pin in the z-axis direction is equal to a moving distance of the guiding member in the x-axis direction.

Further, distal ends of the end portions of the first and second printed circuit boards disposed overlapping each other, may be aligned with each other, and the first printed circuit board and the second printed circuit board having the distal ends thereof aligned with each other may be electrically connected to each other at the ends portions thereof.

Further, the end portion of the first printed circuit board fixed to the guiding portion may be movable relative to the end portion of the second printed circuit board to align the distal ends with each other.

Embodiments of the present disclosure provide at least the following effects.

By raising the printed circuit board away from an underlying printed circuit board using air, damage to the printed circuit boards may be minimized.

By raising the printed circuit board away from an underlying printed circuit board using air, damage to the printed circuit boards may be reduced or effectively prevented in a manufacturing process.

The effects of the present disclosure are not limited to the above-described effects and other effects which are not described herein will become apparent to those skilled in the art from the following description.

BRIEF DESCRIPTION OF THE DRAWINGS

The above and other features of the present disclosure will become more apparent by describing in detail exemplary embodiments thereof with reference to the attached drawings, in which.

DETAILED DESCRIPTION

Figure 1:
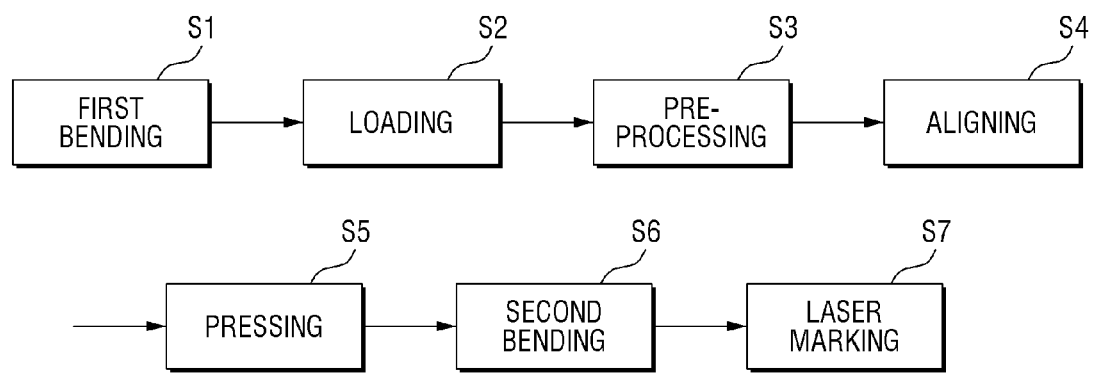
FIG. 1 is a block diagram showing an embodiment of a manufacturing method of a display device according to the invention.

The advantages and features of the invention and methods for achieving the advantages and features will be apparent by referring to the embodiments to be described in detail with reference to the accompanying drawings. However, the invention is not limited to the embodiments disclosed hereinafter, but can be implemented in diverse forms. The matters defined in the description, such as the detailed construction and elements, are nothing but specific details provided to assist those of ordinary skill in the art in a comprehensive understanding of the invention, and the invention is only defined within the scope of the appended claims.

Where an element is described as being related to another element such as being "on" another element or "located on" a different layer or a layer, an element is located directly on another element or a layer or an element is located on another element via another layer or still another element. In contrast, where an element is described as being is related to another element such as being "directly on" another element or "located directly on" a different layer or a layer, an element is located on another element or a layer with no intervening element or layer therebetween. In the entire description of the invention, the same drawing reference numerals are used for the same elements across various figures.

Although the terms "first, second, and so forth" are used to describe diverse constituent elements, such constituent elements are not limited by the terms. The terms are used only to discriminate a constituent element from other constituent elements. Accordingly, in the following description, a first constituent element may be a second constituent element.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the attached drawings.

FIG. 1 is a block diagram showing an embodiment of a manufacturing method of a display device according to the invention. Referring to FIG. 1, a manufacturing method of a display device according to an embodiment of the present disclosure includes a first bending operation 51, a loading operation S2, a pre-processing operation S3, an aligning operation S4, a pressing operation S5, a second bending operation S6 and a laser marking operation S7.

In an embodiment of a manufacturing method of a display device, the first bending operation 51 may be performed. The first bending operation 51 may include deforming such as by bending a printed circuit board of a panel assembly of the display device, such as where the panel assembly includes at least two printed circuit boards.

Hereinafter, an embodiment of a panel assembly 1000 used in a manufacturing method for manufacturing a display device according to the invention will be described with reference to the drawings. The panel assembly 1000 may be a sub-assembly of the finally formed display device.

Figure 2:
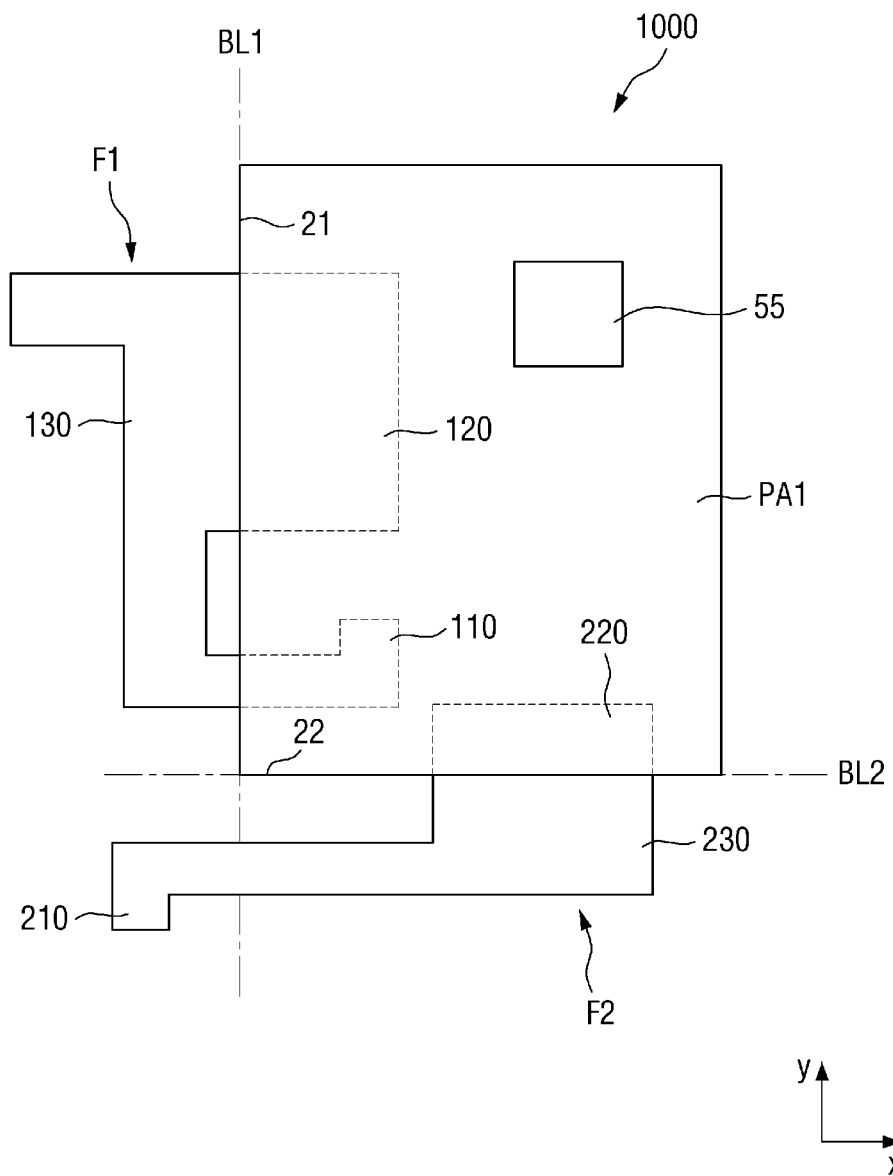
FIG. 2 and FIG. 3 are top plan views of an embodiment of configurations of a panel assembly used in a manufacturing method of a display device according to the invention.
Figure 3:
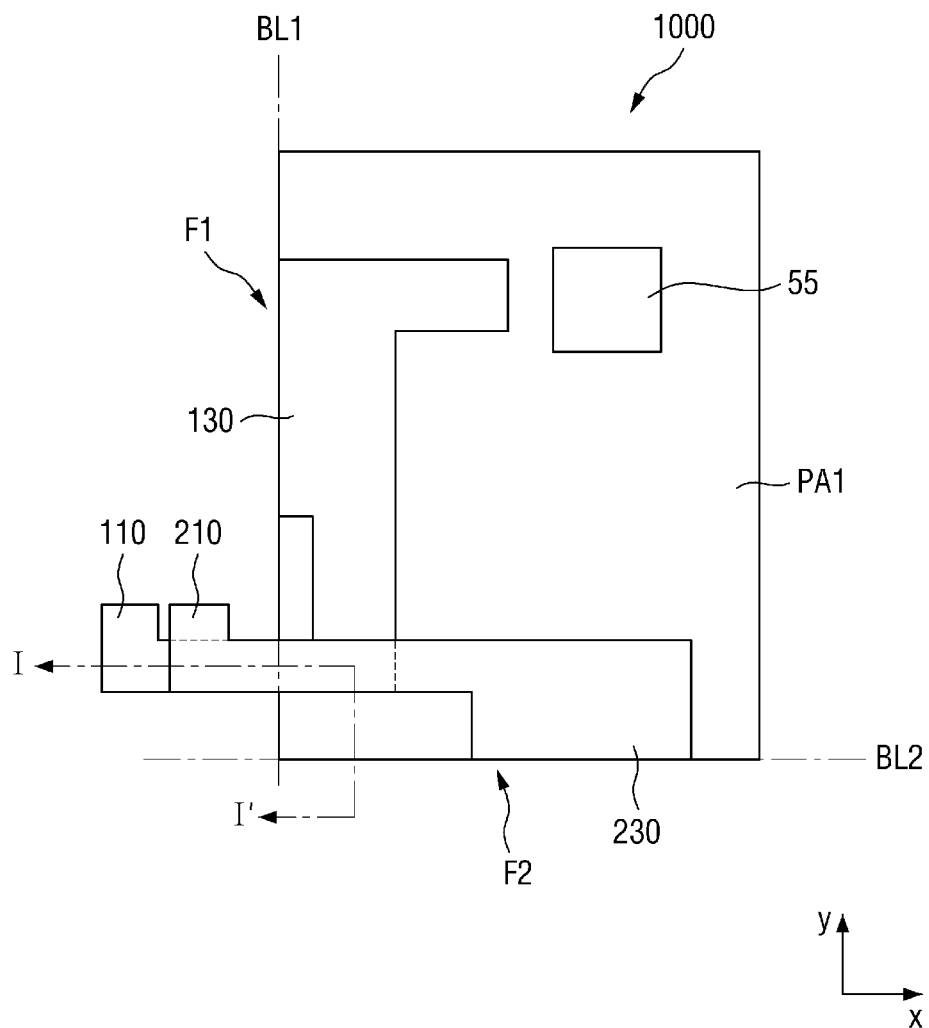
Figure 4:
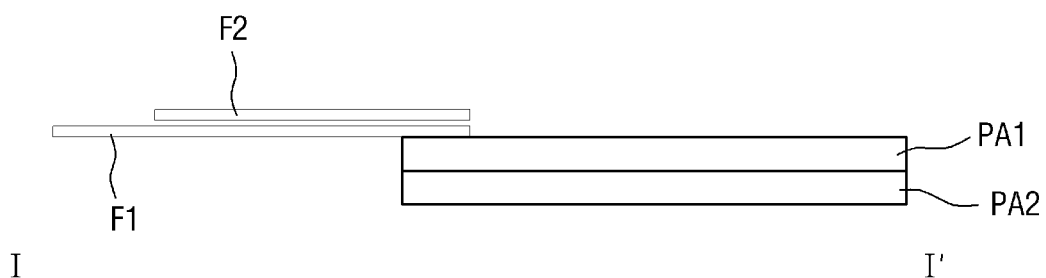
FIG. 4 is a cross-sectional view taken along line I-I' of FIG. 3.

FIGS. 2 and 3 are top plan views of an embodiment of a configuration of the panel assembly 1000 used in the manufacturing method for manufacturing a display device according to the invention. FIG. 4 is a cross-sectional view taken along line I-I' of FIG. 3.

Referring to FIGS. 2 to 4, in one embodiment, the panel assembly 1000 includes a first panel PA1, a second panel PA2, a first printed circuit board F1 and a second printed circuit board F2.

In one embodiment, the first panel PA1 and the second panel PA2 may be sequentially stacked in a thickness direction of the display device. FIGS. 2 to 3 show the rear surface of the first panel PA1. As shown in FIG. 4, the second panel PA2 may be disposed below the first panel PA1.

In one embodiment, the first panel PA1 may be a display panel. The term "display panel" as used herein can be understood as a term collectively referring to all kinds of display panels which generate and display an image under control of a driving/control signal applied thereto and using light. In an embodiment, for example, the display panel may be a display panel of a liquid crystal display device or a display panel of an organic light emitting display device.

In one embodiment, the display panel may be a flexible display having flexibility.

In one embodiment, the second panel PA2 may include an input detection unit (not shown). That is, the second panel PA2 may include components which function to detect a stimulus provided from outside thereof and/or outside the display device, and generate a specific signal in response to the stimulus.

In one embodiment, the second panel PA2 may be a touch screen panel (TSP).

FIG. 4 shows a case where the first panel PA1 is disposed on (e.g., above) the second panel PA2, but the stacking order is not limited thereto. That is, in another embodiment, the second panel PA2 may be stacked on (e.g., above) the first panel PA1.

Although not shown in FIG. 4, a window may be disposed below the second panel PA2. That is, in one embodiment, the panel assembly 1000 may include a window which defines an outer surface thereof. The displayed image may be visible through the window, such as at a viewing side of the display device.

FIGS. 2 and 3 show the rear surface of the first panel PA1. That is, the front surface of the first panel PA1 is in contact with the second panel PA2, and the rear surface of the first panel PA1 is as shown in FIG. 2 or 3. In the top plan view, the first panel PA1 (or the second panel PA2) may have an overall shape defining plural sides thereof connected to each other, to form the overall shape.

In one embodiment, the first printed circuit board F1 may be disposed at a first side 21 of the panel assembly 1000. The first printed circuit board F1 may be electrically connected to the first panel PA1. In other words, the first printed circuit board F1 may receive and/or transmit a signal required for driving the first panel PA1, to the first panel PA1, via the connection therebetween.

In one embodiment, the first printed circuit board F1 may include a first connection portion 110, a first attachment portion 120 and a first circuit portion 130.

The first connection portion 110 may be electrically connected to a second connection portion 210, which will be described later. In one embodiment, a plurality of connection pads (not shown) may be disposed in the first connection portion 110, such as on a base substrate of the first printed circuit board F1. In addition, in one embodiment, a pre-bonding portion 71 (shown in FIG. 5) may be disposed at the first connection portion 110, such as on the base substrate of the printed circuit board F1.

The pre-bonding portion 71 may bond the first connecting portion 110 and the second connecting portion 210 to each other, in a pre-pressing operation to be described later. To this end, the pre-bonding portion 71 may include a thermal sensitive adhesive ("TSA").

The first attachment portion 120 may be attached to the first panel PA1. Accordingly, the first attachment portion 120 can electrically connect the first printed circuit board F1 to the first panel PA1.

The first circuit portion 130 may extend from the first attachment portion 120. With the first attachment portion 120 on the first panel PA1, the first printed circuit board F1 may extend further from edges of the first panel PA1 such as at the first circuit portion 130 thereof. A plurality of circuit patterns may be disposed or formed at the first circuit portion 130, such as on the base substrate of the first printed circuit board F1. The plurality of circuit patterns serve to transmit signals therethrough, and thus can transmit signals to and/or from the first panel PA1.

The second printed circuit board F2 may be disposed at a second side 22 of the panel assembly 1000. In one embodiment, the second side 22 may be a side portion extending from one end of the first side 21. The second printed circuit board F2 may be electrically connected to the second panel PA2. In other words, the second printed circuit board F2 may receive and/or transmit a signal required for driving the second panel PA2, to the second panel PA2, via the connection therebetween.

In one embodiment, the second printed circuit board F2 may include a second connection portion 210, a second attachment portion 220 and a second circuit portion 230.

In one embodiment, the second connection portion 210 may include a plurality of connection pads, such as on a base substrate of the second printed circuit board F2. The second connection portion 210 of the second printed circuit board F2 may be bonded to the first connection portion 110 of the first printed circuit board F1, in a pressing operation to be described later.

The second attachment portion 220 may be attached to the second panel PA2. Accordingly, the second attachment portion 220 can electrically connect the second printed circuit board F2 to the second panel PA2.

The second circuit portion 230 may extend from the second attachment portion 220. With the second attachment portion 220 on the second panel PA2, the second printed circuit board F2 may extend further from edges of the second panel PA2 such as at the second circuit portion 230 thereof. A plurality of circuit patterns may be disposed or formed on the second circuit portion 230, such as on the base substrate of the second printed circuit board F2. The plurality of circuit patterns serve to transmit signals, and thus can transmit signals to and/or from the second panel PA2.

An embodiment of a manufacturing apparatus for manufacturing a display device according to the invention may further include a marking portion 55. The marking portion 55 may be disposed on the rear surface of the first panel PA1. It is possible to mark necessary information in the marking portion 55 by irradiating a laser in the laser marking operation S7 to be described later. This will be described in detail later.

The first bending operation S1 will be described with reference to FIG. 3 taken with FIG. 2.

The first bending operation S1 may include bending the first printed circuit board F1 and/or the second printed circuit board F2, such as from an initial position thereof shown in FIG. 2.

The first printed circuit board F1 and the second printed circuit board F2 have flexibility and can be deformed or bent accordingly.

In one embodiment, the first printed circuit board F1 may be bent along a first bending line BL1 parallel to a y-axis, and the second printed circuit board F2 may be bent along a second bending line BL2 parallel to an x-axis crossing the y-axis. The bending lines may correspond or be aligned with a side of the first panel PA1, without being limited thereto. The bending lines may respectively define bending axes about which a printed circuit board is deformed such as by bending thereof.

The overall display device and/or components thereof, may be disposed in a plane defined by first and second directions (e.g., the x-axis and the y-axis). A thickness direction of the overall display device and/or components thereof extends in a third direction (e.g., z-axis direction) crossing each of the first and second directions. The first to third directions may be perpendicular to each other, without being limited thereto.

Further, the first printed circuit board F1 and the second printed circuit board F2, portions of which are disposed on the front surface of the first panel PA1 (shown by dotted lines in FIGS. 2 and 3), may be bent along the bending lines described above, toward the rear surface of the first panel PA1 to dispose other portions thereof on the rear surface as shown in FIG. 4. Accordingly, at least a portion of the first circuit portion 130 and at least a portion of the second circuit portion 230 may be disposed on the rear surface of the first panel PA1. More particularly, among portions of a printed circuit board which extend further than an edge of a panel, a first portion may be disposed on the rear surface of the panel while a second portion thereof may connect the first portion to a remaining portion of the printed circuit board at the front surface of the panel.

Further, when the first printed circuit board F1 and the second printed circuit board F2 are bent along the first bending line BL1 and the second bending line BL2 respectively, the first connection portion 110 and the second connection portion 120 may be disposed outside the first panel PA1 as illustrated in FIG. 3. That is, distal ends of the first and second printed circuit boards F1 and F2 at the first connection portion 110 and the second connection portion 120 extend further than an edge of the first panel PA1, such as further than a same edge (e.g., first side 21). Also, the first connection portion 110 and the second connection portion 120 may at least partially overlap each other. That is, as shown in FIG. 4, the first printed circuit board F1 and the second printed circuit board F2 may at least partially overlap each other in a cross-sectional view. A distal end portion of the first printed circuit board F1 may be covered (e.g., overlapped) by a distal end portion of the second printed circuit board F2.

Subsequently, referring to FIG. 5, after the first bending operation S1, the loading operation S2 and the pre-processing operation S3 may be performed. The loading operation S2 and the pre-processing operation S3 may be performed by one or more embodiment of a manufacturing apparatus for manufacturing a display device according to the invention.

Figure 5:
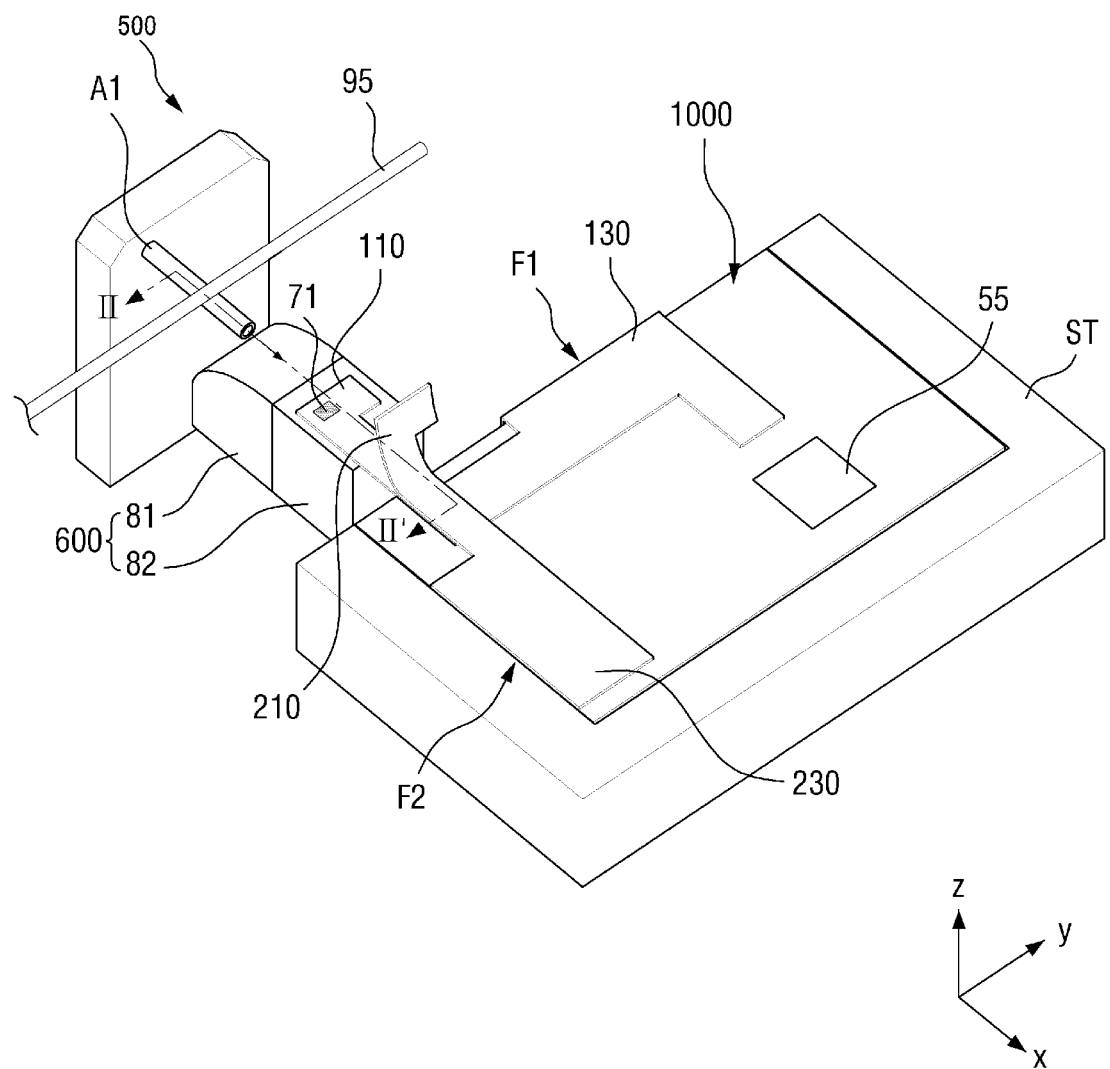
FIG. 5 is a partial perspective view of an embodiment of a manufacturing apparatus for manufacturing a display device according to the invention.
Figure 6:
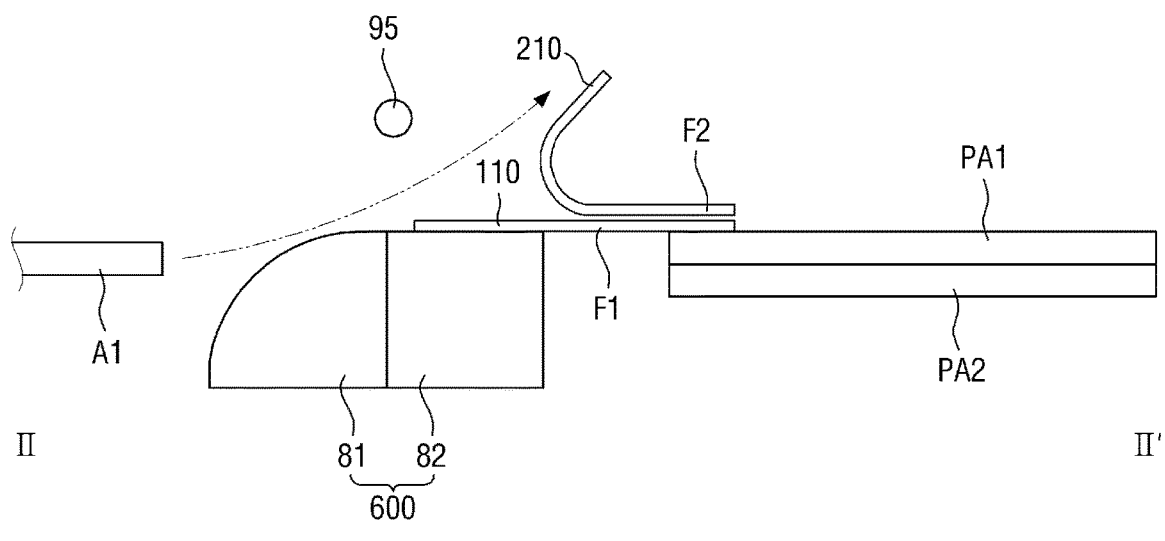
FIG. 6 and FIG. 7 are cross-sectional views taken along line II-II' of FIG. 5, illustrating an embodiment of processes in a method of manufacturing a display device using the manufacturing apparatus according to the invention
Figure 7:
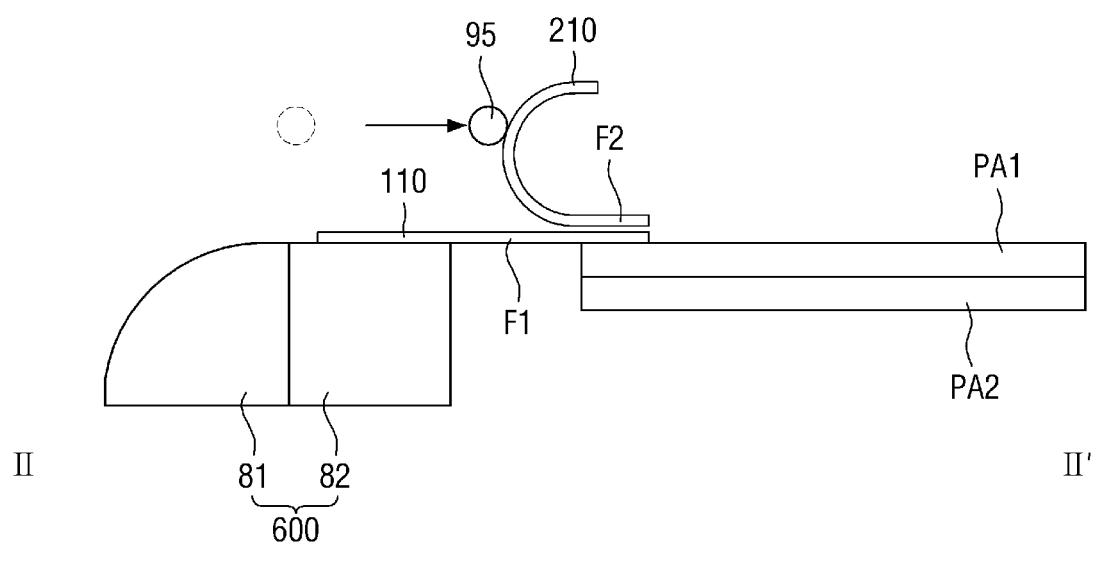

FIG. 5 is a partial perspective view of an embodiment of a manufacturing apparatus for manufacturing a display device according to the invention. FIGS. 6 and 7 are cross-sectional views taken along line II-II' of FIG. 5 illustrating an embodiment of a process in a method of manufacturing a display device using the manufacturing apparatus according to the invention.

Referring to FIGS. 5 to 7, in one embodiment, a manufacturing apparatus of a display device may include a stage ST, an air blower 500, a backup (support) 600 and a fixing bar 95.

The stage ST can support the panel assembly 1000 having the bent printed circuit boards, thereon. The stage ST may provide a space or planar area (e.g., in the x-axis and y-axis plane) in which the panel assembly 1000 is seated. In one embodiment, the stage ST may fix the panel assembly 1000 relative to a portion of the manufacturing apparatus, such as at a specific location within the space or planar area. The manner in which the stage ST fixes the panel assembly 1000 is not limited. In an embodiment, for example, the stage ST may fix the panel assembly 1000 in a location on the stage ST, by a vacuum suction method. In this case, a plurality of suction holes (not shown) may be disposed at the stage ST to apply a holding force to the panel assembly 1000.

Similar to the panel assembly 1000, the stage ST may have an overall shape defining plural sides thereof connected to each other, to form the overall shape. The backup 600 may be disposed at one side of the stage ST. The backup 600 may fix the second connection portion 210 at a location relative to a portion of the manufacturing apparatus. The second connection portion 210 which extends further than the edge of the first panel PA1 corresponds to the backup 600 which is extended further than an edge of the stage ST.

In one embodiment, the backup 600 may include a guide portion 81, and a fixing portion 82 for fixing the first connection portion 110. The fixing portion 82 may support the first and second connection portions 110 and 210 overlapping each other The fixing portion 82 may fix the first connection portion 110. In one embodiment, the fixing portion 82 may fix the first connection portion 110 by a vacuum suction method. To this end, a vacuum suction pad (not shown) may be disposed on the fixing portion 82 to apply a holding force to the first connection portion 110.

The guide portion 81 may be disposed at one side or at the distal end of the fixing portion 82. The guide portion 81 includes an inclined surface which has a length extending in an x-axis direction and the length rises in a z-axis direction. The guide portion 81 may serve to guide air provided from the air blower 500, which will be described later.

The inclined surface included in the guide portion 81 may be a curved surface or a flat surface. When the guide portion 81 includes a curved surface, the curved surface may have a certain curvature.

In one embodiment, the backup 600 may move in one direction selected from the x, y and z axes. Accordingly, the backup 600 can adjust the position of the first connection portion 110 supported thereon, in the aligning operation S4 to be described later.

The air blower 500 may be disposed at one side of the backup 600. The air blower 500 may include at least one nozzle through which air is expelled. FIG. 5 shows a case in which the air blower 500 includes a first nozzle A1.

The first nozzle A1 may face the guide portion 81 of the backup 600. Also, the first nozzle A1 extends in the x-axis direction, so that the air provided from the first nozzle A1 can travel in the x-axis direction. The air provided from the first nozzle A1 may be guided and raised by the guide portion 81. Accordingly, the air may raise the second connection portion 210 in the z-axis direction (see FIG. 6).

The fixing bar 95 may be disposed above the backup 600. The fixing bar may have a length which extends in the y-axis direction. The fixing bar 95 may move in the x-axis direction. The fixing bar 95 may support a lower surface of the second printed circuit board F2 which is tilted by the air, so that the second printed circuit board F2 can be held in a tilted state (see FIG. 7).

Hereinafter, the loading operation S2 and the pre-processing operation S3 using an embodiment of a manufacturing apparatus for manufacturing a display device according to the invention will be described.

In one embodiment, with the panel assembly 1000 having the bent printed circuit boards on the stage ST and the first connection portion 110 held fixed at the fixing portion 82, the loading operation S2 may include raising the second connection portion 210 from the fixed first connection portion 110 overlapped thereby. The raising of the second portion away from the first connection portion 110 may be performed by providing air to the second connection portion 210 of the panel assembly 1000 seated on the stage ST, and supporting the raised second connection portion 210 using the fixing bar 95. The air may be provided to an interface of the first and second connection portions 110 and 210, to separate and raise the second connection portion 210 from the first connection portion 110.

The operation of raising the second connection portion 210 by jetting air toward the guide portion 81 by the first nozzle A1 may be performed. The air provided from the first nozzle A1 may be directed toward the guide portion 81, and a path of the air may be guided and raised by the inclined surface included in the guide portion 81 toward the second connection portion 210. The rising air may be provided to the lower surface of the second connection portion 210, at the interface with the first connection portion 110, to raise the second connection portion 210 (see FIG. 6).

The operation of moving the fixing bar 95 toward the raised second connection portion 210 may be performed. The fixing bar 95 moves in the x-axis direction to support the raised second connection portion 210, so that the second printed circuit board F2 can be fixed in a tilted state (see FIG. 7). The first connection portion 110 remains in a flat (e.g., planar) state as being fixed to the fixing portion 82, while the second connection portion 210 is raised to be separated from the first connection portion 110.

Figure 8:
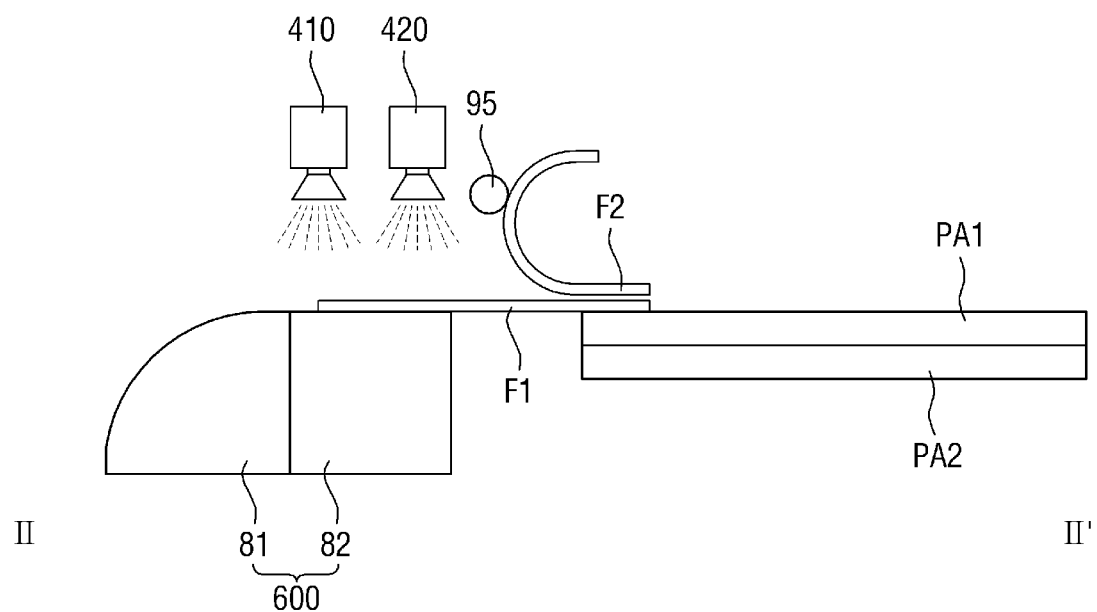
FIG. 8 is a partial cross-sectional view taken along line II-II' of FIG. 5, illustrating an embodiment of another process in a method of manufacturing a display device using the manufacturing apparatus according to the invention.

Then, referring to FIG. 8, the pre-processing operation S3 may be performed.

FIG. 8 is a partial cross-sectional view taken along line II-II' of FIG. 5, illustrating an embodiment of another process in a method of manufacturing a display device using the manufacturing apparatus according to the invention.

The pre-processing operation S3 may be performed in a state in which a portion of the second printed circuit board F2 (e.g., the second connection portion 210) is tilted.

In one embodiment, an exemplary embodiment of a manufacturing apparatus of a display device may further include a first pre-processing device 410 and/or a second pre-processing device 420.

The pre-processing operation S3 may be performed by the first pre-processing device 410 and/or the second pre-processing device 420.

While the second connection portion 210 is raised to be separated from the first connection portion 110, a surface of the first connection is exposed from the second connection portion 210. A pre-processing operation may be performed on the exposed portion of the first connection portion 110. In one embodiment, the first pre-processing device 410 may perform a plasma process on the surface of the first connection portion 110 exposed from the previously overlapping second connection portion 220. In addition, in one embodiment, the second pre-processing device 420 may perform a flux process on the surface of the first connection portion 110.

In one embodiment, the plasma process by the first pre-processing device 410 and the flux process by the second pre-processing device 420 may be optional. However, the present disclosure is not limited thereto. In another embodiment, the plasma process by the first pre-processing device 410 and the flux process by the second pre-processing device 420 may be performed sequentially or simultaneously.

Figure 9:
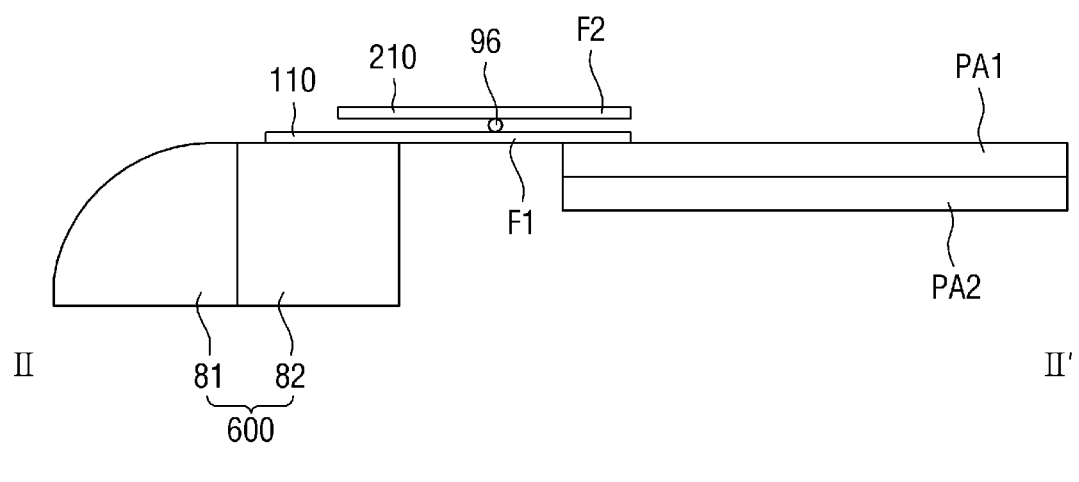
FIG. 9 and FIG. 10 are partial cross-sectional views taken along line II-II' of FIG. 5, illustrating an embodiment of still another process in a method of manufacturing a display device using the manufacturing apparatus according to the invention.
Figure 10:
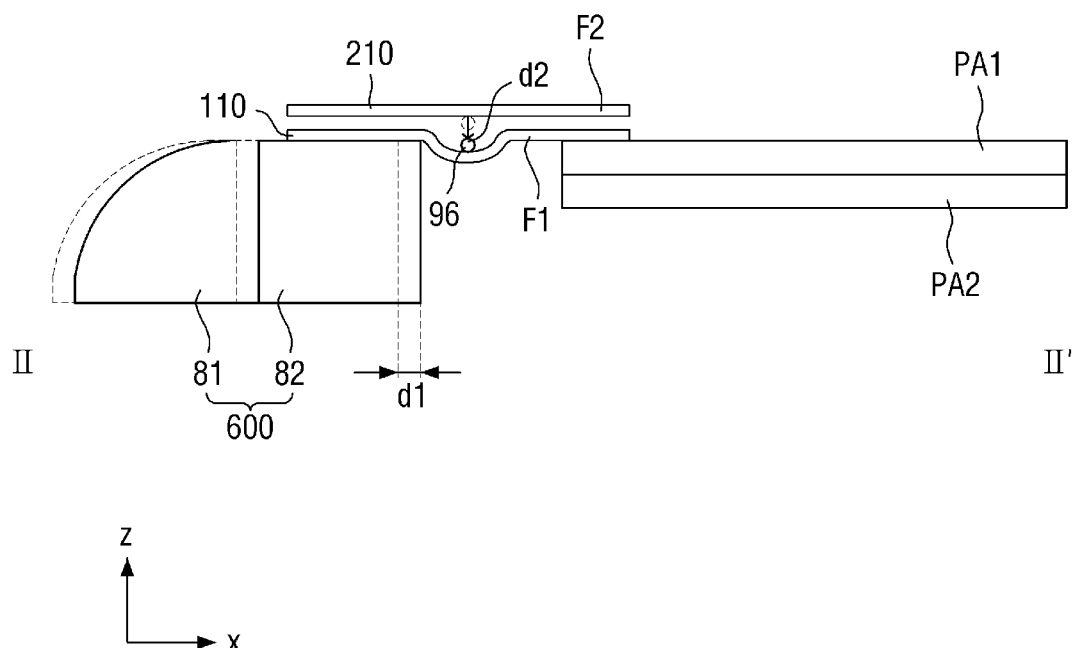

FIGS. 9 and 10 are partial cross-sectional views taken along line II-II' of FIG. 5, illustrating an embodiment of still another process in a method of manufacturing a display device using the manufacturing apparatus according to the invention.

Referring to FIGS. 9 and 10, the aligning operation S4 may be performed. In one embodiment, an embodiment of a manufacturing apparatus for manufacturing a display device may further include a push pin 96. The push pin 96 may have a bar shape with a length thereof extending in the y-axis direction.

The push pin 96 may be interposed between the first printed circuit board F1 and the second printed circuit board F2. That is, in the manufacturing method, the aligning operation S4 may include disposing the push pin 96 between the first printed circuit board F1 and the second printed circuit board F2. In an embodiment, the push pin 96 may disposed between the first printed circuit board F1 and the second printed circuit board F2 while the fixing bar 95 holds the second connection portion 210 raised to be separated from the first connection portion 110. Once the push pin 96 is disposed between the first printed circuit board F1 and the second printed circuit board F2, the fixing bar 95 may be removed while the push pin 96 remains between the first printed circuit board F1 and the second printed circuit board F2.

After the push pin 96 is interposed between the first printed circuit board F1 and the second printed circuit board F2, the backup 600 may move in the x-axis direction while fixing the first connection portion 110. In this case, the distal end of the first connection portion 110 may move in the x-axis direction as the backup 600 moves (see FIG. 10). With the first printed circuit board F1 fixed to the first panel PA1, the moving of the distal end of the first connection portion 110 may shorten an initial length of the first connection portion 110 and form a recess at the push pin 96 as shown in FIG. 10. While the distal end of the first connection portion 110 moves in the x-axis direction, the distal end of the second printed circuit board F2 remains stationary such that the first printed circuit board F1 moves relative to the second printed circuit board F2.

Thus, the distal end of the first connection portion 110 and the distal end of the second connection portion 210 may be aligned with each other. FIG. 10 shows a case where the distal end of the first connection portion 110 and the distal end of the second connection portion 210 are aligned.

The push pin 96 may press the first connection portion 110 to reduce the length of the first connection portion 110 in the x-axis direction. That is, the push pin 96 may press the first connection portion 110 while moving in the z-axis direction in a state of being in contact with the first connection portion 110. The pressing of the push pin 96 forms the recess in the first connection portion 110.

In one embodiment, the push pin 96 may move in conjunction with the backup 600. That is, the push pin 600 may move in proportion to the amount of movement of the backup 600.

In other words, although the backup 600 moves in the x-axis direction and the push pin 96 moves in the z-axis direction, the movement amounts may be proportional to each other.

In one embodiment, the movement amount of the backup 600 may be the same as the movement amount of the push pin 96. That is, a first distance d1 in the x-axis direction, which is a moving distance of the backup 600, may be substantially the same as a second distance d2 in the z-axis direction, which is a moving distance of the push pin 96.

In one embodiment, interlocking of the backup 600 and the push pin 96 may utilize a cam structure (not shown). That is, when the backup 600 moves in the x-axis direction, a driving force whose direction is changed by the cam structure may move the push pin 96 in the z-axis direction. Accordingly, the movement amounts of the backup 600 and the push pin 96 may be proportional to each other while being in different directions from each other. In the aligning operation S4, the first and second connection portions 110 and 210 may not be fixed to each other.

As described above, when the backup 600 and the push pin 96 interlock with each other and the push pin 96 pushes down the first connection portion 110, the tension of the first connection portion 110 can be kept constant. When the backup 600 is moved in a conventional aligning operation, a part of the first connection portion 110 may rise up due to a tension applied to the first connection portion 110. Alternatively, the first connection portion 110 may be detached from the backup 600 or cause damage to the second connection portion 210 by applying a force to the backup 600. As described above, in one or more embodiment of the aligning operation S4, when the first connection portion 110 is pressed downward and the tension is kept constant, damage to the second connection portion 210 by the first connection portion 110 or detachment thereof from the backup 600 may be reduced or effectively prevented.

Figure 11:
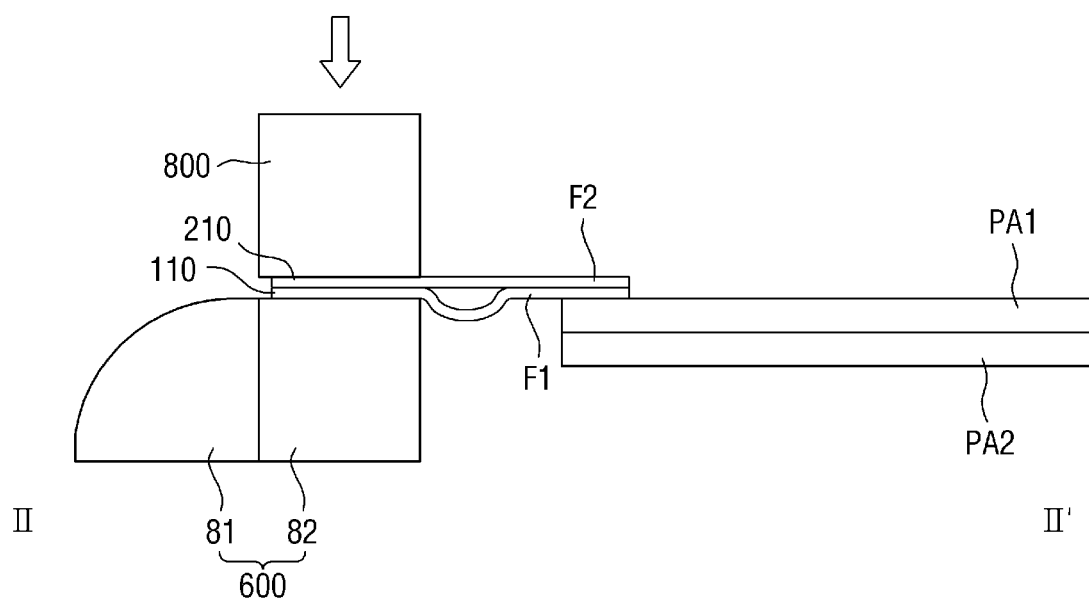
FIG. 11 is a partial cross-sectional view taken along line II-II' of FIG. 5, illustrating an embodiment of yet another process in a method of manufacturing a display device using the manufacturing apparatus according to the invention.

FIG. 11 is a partial cross-sectional view taken along line II-II' of FIG. 5, illustrating an embodiment of yet another process in a method of manufacturing a display device using the manufacturing apparatus according to the invention.

Referring to FIG. 11, the pressing operation S5 for pressing the first connection portion 110 and the second connection portion 210 to each other may be performed.

In one embodiment, the pressing operation S5 may include a pre-pressing operation and a main pressing operation. The pre-pressing operation may use the pre-bonding portion 71 disposed on the first connection portion 110 (see FIG. 5). That is, the first connection portion 110 and the second connection portion 210 may be bonded to each other after the pre-bonding portion 71 disposed on the first connection portion 110 is partially melted. The pre-bonding portion may be partially melted with the distal ends of the first and second connection portions 110 and 210 aligned with each other, without being limited thereto.

That is, the first connection portion 110 and the second connection portion 210 may be bonded to each other using the TSA of the pre-bonding portion 71 disposed on the first connection portion 110.

After the pre-pressing operation to partially melt the pre-bonding portion 71 such as by applying heat thereto, the main pressing operation may be performed.

An embodiment of a manufacturing apparatus of a display device according to the invention may further include a pressing (member) portion 800. The main pressing operation may be performed by the pressing portion 800. That is, the first connection portion 110 and the second connection portion 210 are bonded to each other by allowing the pressing portion 800 to press the first connection portion 110 and the second connection portion 210 in the pre-pressed state. By pressing the first connection portion 110 and the second connection portion 210 in the pre-pressed state (e.g., the partially melted pre-bonding portion 71), the first connection portion 110 and the second connection portion 210 may be electrically connected to each other by the main pressing operation.

Once the first connection portion 110 and the second connection portion 210 are pressed in the main pressing operation, the pressing portion 800 may be removed to leave the distal end portions of the first connection portion 110 and the second connection portion 210 extended further than the edge of the first display panel P1 and overlapping each other.

Additionally, the push pin 96 may be removed from between the first connection portion 110 and the second connection portion 210. Since the distal ends of first connection portion 110 and the second connection portion 210 are fixed to each other at the backup 600 and the ends of the first connection portion 110 and the second connection portion 210 opposite to the distal ends are fixed to the first panel PA1, the push pin 96 may be removed from between the first connection portion 110 and the second connection portion 210.

The second bending operation S6 and the laser marking operation S7 will be described with reference to FIGS. 12 and 13.

Figure 12:
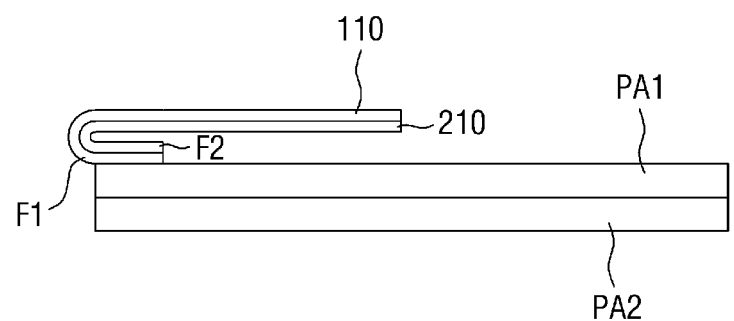
FIG. 12 and FIG. 13 are partial cross-sectional views taken along line II-II' of FIG. 5, illustrating an embodiment of yet another process in a method of manufacturing a display device using the manufacturing apparatus according to the invention
Figure 13:
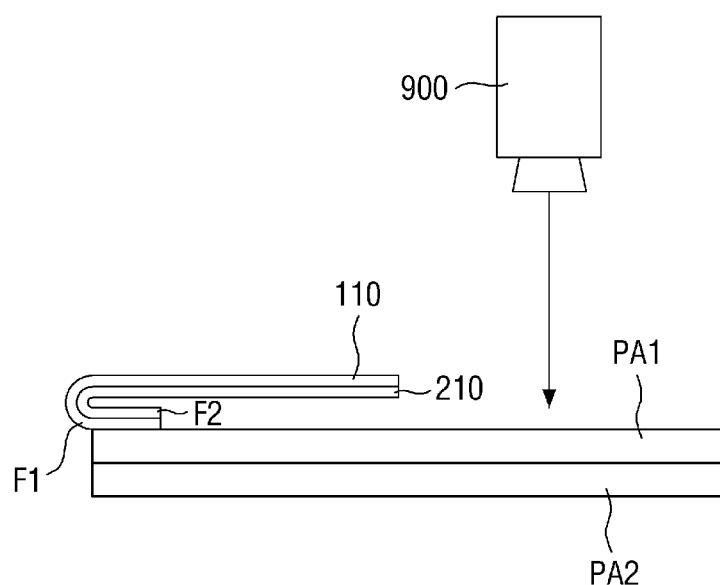

FIGS. 12 and 13 are partial cross-sectional views taken along line II-II' of FIG. 5, illustrating an embodiment of yet another process in a method of manufacturing a display device using the manufacturing apparatus according to the invention.

Referring to FIG. 12, the second bending operation S6 may be performed. The second bending operation S6 may include further bending the first connection portion 110 and the second connection portion 210 which are bonded to each other from the main pressing operation.

In the second bending operation S6, the first connection portion 110 and the second connection portion 210 each extended further than the edge of the first display panel PA1 and overlapping each other may together be positioned on the rear surface of the first panel PA1 by further bending the first connection portion 110 and the second connection portion 210 in the x-axis direction (see FIG. 11 to FIG. 12). Accordingly, the first connection portion 110 and the second connection portion 210 disposed non-overlapping each other as being extended further than the first panel PA1, may overlap the first panel PA1 and the second panel PA2 by the second bending operation S6.

Then, referring to FIG. 13, the laser marking operation S7 may be performed. The laser marking operation S7 may include allowing a laser irradiating apparatus 900 to irradiate a laser to the marking portion 55 (see FIG. 1) disposed on the rear surface of the first panel PA1. The marking portion 55 of the rear surface of the first panel PA1 is exposed to outside thereof, such that the irradiated laser is incident thereto.

The laser provided from the laser irradiating apparatus 900 may dispose information regarding the panel assembly by the marking portion 55 on the rear surface of the first panel PA1. The information displayed on the marking portion 55 is not limited and may include letters or numbers, such as those related to identifying or tracing the panel assembly. The panel assembly 1000 (see FIGS. 5 and 6) may be processed as described above, to complete manufacturing of the panel assembly 1000 as a sub-component of a display device. The sub-component panel assembly 1000 may be further processed and/or assembled with other components of the display device, to manufacture a complete display device.

Although the embodiments of the invention have been disclosed for illustrative purposes, those skilled in the art will appreciate that various modifications, additions and substitutions are possible, without departing from the scope and spirit of the invention as disclosed in the accompanying claims.

While the present invention has been particularly illustrated and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. A manufacturing method of a display device, comprising:
   loading, on a stage, a panel assembly including:
   a display panel which is drivable by a signal applied thereto to display an image, and
   a first printed circuit board and a second printed circuit board through which the signal is transmittable to the display panel, attached to the display panel, end portions of the first and second printed circuit boards disposed overlapping each other;

providing a jet of air to the overlapping end portion of the second printed circuit board to raise the overlapping end portion of the second printed circuit board away from the end portion of the first printed circuit board and expose the end portion of the first printed circuit board;

fixing the raised end portion of the second printed circuit board away from the exposed end portion of the first printed circuit board;

pre-processing the exposed end portion of the first printed circuit board; and aligning a distal end of the pre-processed end portion of the first printed circuit board and a distal end of the end portion of the second printed circuit board.

2. The manufacturing method of claim 1, wherein the end portions of the first and second printed circuit boards are overlapped along an x-axis direction, said loading, on a stage, a panel assembly, includes disposing the overlapping end portions of the first and second printed circuit boards on a guide portion having an inclined surface inclined in the x-axis direction, and said providing a jet of air to the overlapping end portion of the second printed circuit board includes jetting the air along the inclined surface of the guide portion, in the x-axis direction, to raise the end portion of the second printed circuit board and expose the end portion of the first printed circuit board.

3. The manufacturing method of claim 2, wherein said fixing the raised end portion of the second printed circuit board includes moving a fixing bar to support a lower surface of the raised end portion away from the exposed surface of the end portion of the first printed circuit board.

4. The manufacturing method of claim 1, wherein said aligning distal ends of the first printed circuit board and the second printed circuit board includes interposing a push pin between the end portions of the first printed circuit board and the second printed circuit board overlapping each other.

5. The manufacturing method of claim 4, wherein said loading, on a stage, a panel assembly, includes disposing the overlapping end portions of the first and second printed circuit boards on a guide portion adjacent to the display panel in an x-axis direction, the end portion of the first printed circuit board fixed to the guide portion, and said aligning distal ends of the first printed circuit board and the second printed circuit board further includes moving in the x-axis direction, the guide portion with the end portion of the first printed circuit board fixed thereto, the moving the guide portion in the x-axis direction moving the push pin away from the end portion of the second printed circuit board in a z-axis direction crossing the x-axis direction, to move the end portion of the first printed circuit board away from the end portion of the second printed circuit board in the z-axis direction.

6. The manufacturing method of claim 5, wherein a moving distance of the push pin in the z-axis direction is equal to a moving distance of the guide portion in the x-axis direction.

7. The manufacturing method of claim 1, further comprising, with the distal ends of the first printed circuit board and the second printed circuit board aligned with each other, electrically connecting the pre-processed end portion of the first printed circuit board to the overlapping end portion of the second printed circuit board.

8. The manufacturing method of claim 1, wherein a portion of the display panel is exposed from the first and second printed circuit boards having the distal ends thereof aligned, further comprising irradiating a laser to the exposed portion of the display panel to perform marking of the display panel assembly.

9. The manufacturing method of claim 1, wherein said pre-processing the exposed end portion of the first printed circuit board includes performing a plasma process or a flux process on the exposed end portion of the first printed circuit board.

* * * * *